United States Patent
Simanapalli

[19]

[11] Patent Number: 6,081,921
[45] Date of Patent: Jun. 27, 2000

[54] BIT INSERTION APPROACH TO CONVOLUTIONAL ENCODING

[75] Inventor: Sivanand Simanapalli, Allentown, Pa.

[73] Assignee: Lucent Technologies Inc., Murray Hill, N.J.

[21] Appl. No.: 08/974,873

[22] Filed: Nov. 20, 1997

[51] Int. Cl.[7] ................................................ H03M 13/03
[52] U.S. Cl. ............................................................ 714/786
[58] Field of Search .................................. 714/786, 792, 714/795, 776, 787, 788, 790; 380/43; 375/341, 265; 341/51; 704/242

[56] References Cited

U.S. PATENT DOCUMENTS

| | | | |
|---|---|---|---|
| 4,293,951 | 10/1981 | Rhodes | 714/786 |
| 4,410,989 | 10/1983 | Berlekamp | 714/762 |
| 5,504,773 | 4/1996 | Padovani et al. | 375/200 |
| 5,727,064 | 3/1998 | Reeds, III | 380/49 |

*Primary Examiner*—Albert Decady
*Assistant Examiner*—Shelly A Chase

[57] ABSTRACT

A convolutional encoder and method convolutionally encode input bits from an input frame. The convolutional encoder has a predetermined bit input source and a logic circuit. The predetermined bit input source inserts a plurality of predetermined bits into an input register with the input bits. The logic circuit has a plurality of shift registers, a plurality of polynomial generators, and an output generator. The plurality of shift registers shift the input register, including the predetermined bits, to generate shifted data. The plurality of polynomial generators generate respective polynomial values in a plurality of polynomial registers from the shifted data. The output generator generates output data in an output register from the polynomial values corresponding to convolutional encoding of the data in the input register.

10 Claims, 5 Drawing Sheets

BIT INSERTION APPROACH TO CONVOLUTIONAL ENCODING

FIELD OF THE INVENTION

The present invention relates generally to the field of encoding, and, more particular, concerns the convolutional encoding of data in communication applications.

BACKGROUND OF THE INVENTION

The application of error correcting codes to data in communication systems ensures reliable processing of communication data and packets to provide high quality of service.

A typical method of error correction is to incorporate parity or similar additional bits in transmitted data bit streams. One standard for achieving error correction is convolutional encoding by a programmable processor, with convolutional encoding being a subset of tree coding techniques. Convolutional encoding utilizes additional coding bits to provide redundancy in transmissions. A number, k, of input binary digits are processed to generate n output binary digits, where n>k. A code rate for such convolutional coding is defined as R=k/n.

In convolutional encoding, a block of n code digits is generated and outputted by the encoder within a particular time unit, with the block of n code digits depending not only on the input block of k digits within the time unit, but also on a block of data digits within a previous span of N time units, in which N>0.

As shown in FIG. 1., a convolutional encoder 10 of the prior art includes an input shift register 12, a logic circuit 14, and an output shift register 16. The convolutional encoder 10 receives k bits in a single input frame 18, which are shifted into the input shift register 12 in each time unit, and concurrently n-bits in the output frame 20 are shifted out by the output shift register 16. Such n bits in the output shift register 16 are generated by the logic circuit 14 from data in the input shift register 12. Thus, every k-bit input frame 18 produces an n-bit output frame 20, with redundancy provided in the output since n>k.

Shift register 12 holds a number K of input frames of k bits plus N previous frames of k bits, so the input shift register 12 is k(K+N) bits in length. The number N is sometimes referred to as the constraint length. The n bits are generated from the stored bits in the input shift register 12 by the logic circuit 14. For example, data from the k(K+N) stages of the input shift register 12 may be added by modulo 2 binary operations to set the bits in the n-stage output register 16.

For a convolutional encoder with a code rate of ½ which may be used in the North American Time Division Multiple Access (TDMA) Standard IS-136, the following two generator polynomials may be used in logic circuit 14 to produce the content of register 16:

$$g_0(D)=1+D^2+D^4 \quad (1)$$

$$g_1(D)=1+D+D^2+D^3+D^4 \quad (2)$$

in which D is a delay operator that may be implemented by a shift operation. For example, $g_0(D)$ could be obtained by combining the register input with signals tapped at the second and fourth stages of a shift register.

For processing sixteen input bits, the convolutional encoder 10 of FIG. 1 receives the sixteen input bits into a register REG_IN serving as the input shift register 12, together with 4 past bits (i.e. N=4), and the register 12 contents are symbolized as:

$$REG\_IN=b_{15},b_{14}, \ldots b_2,b_1,b_0,b_{-1}, \ldots b_{-4}. \quad (3)$$

Equations (1)–(2) above may then be implemented in the logic circuit 14, for example, with a pair of registers REG_$g_0$ and REG_$g_1$ in Equations as follows:

$$REG\_g_0=REG\_IN \oplus (REG\_IN<<2) \oplus (REG\_IN<<4) \quad (4)$$

$$REG\_g_1=REG\_g_0 \oplus (REG\_IN<<1) \oplus (REG\_IN<<3) \quad (5)$$

with $\oplus$ being an exclusive-OR operation on the registers, and with the "<<S" operation indicating a left shift by S bits, which implements the delays in Equations (1)–(2).

In prior art convolutional encoding, the encoded output is obtained by interleaving REG_$g_0$ and REG_$g_1$ in an output register REG_OUT such as the output shift register 16 having thirty-two encoder bits as follows:

$$REG\_OUT=g_0[15], g_1[15], g_0[14], g_1[14], \ldots g_0[0], g_1[0] \quad (6)$$

in which $g_R[I]$ indicates the $I^{TH}$ bit of the $R^{TH}$ register.

Heretofore, such interleaving of registers to obtain the encoded output has required a majority of the processing cycles involved in convolutional encoding procedures. For example, in prior art digital signal processors, 3*m cycles per input bit is a typical processing cycle overhead for a 1/m rate encoder utilizing a Lucent Technologies DSP1600 processor. In contrast, for an encoder utilizing the invention, the processing overhead is three cycles per input bit, regardless of the rate of the encoder.

It is recognized herein that the number of processing cycles for performing convolutional encoding may be reduced by eliminating the interleaving of registers.

In accordance with the present invention a stream of input bits is convolutionally encoded by initially storing a predetermined pattern of bits in an input register together with the input bits. A group of polynomial signals is produced by combining a plurality of variously shifted versions of the input register contents, and the encoded output is generated by combining polynomial signals.

BRIEF DESCRIPTION OF THE DRAWINGS

The features and advantages of the disclosed convolutional encoder and method are readily apparent and are to be understood by referring to the following detailed description of the preferred embodiments of the present invention, taken in conjunction with the accompanying drawings, in which.

DESCRIPTION OF THE PREFERRED EMBODIMENTS

Figure 1:
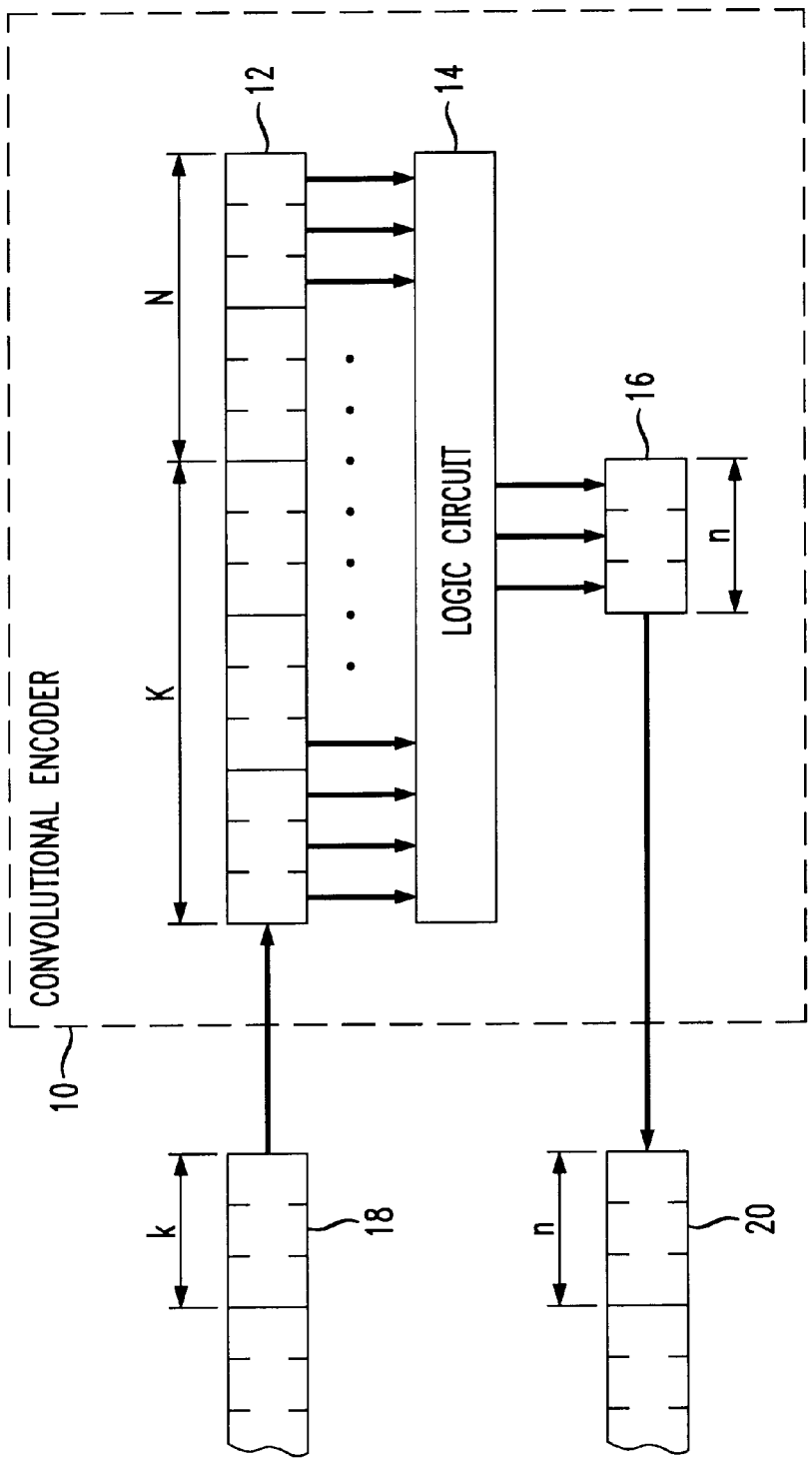
FIG. 1 is a schematic block diagram of a convolutional encoder of the prior art.
Figure 2:
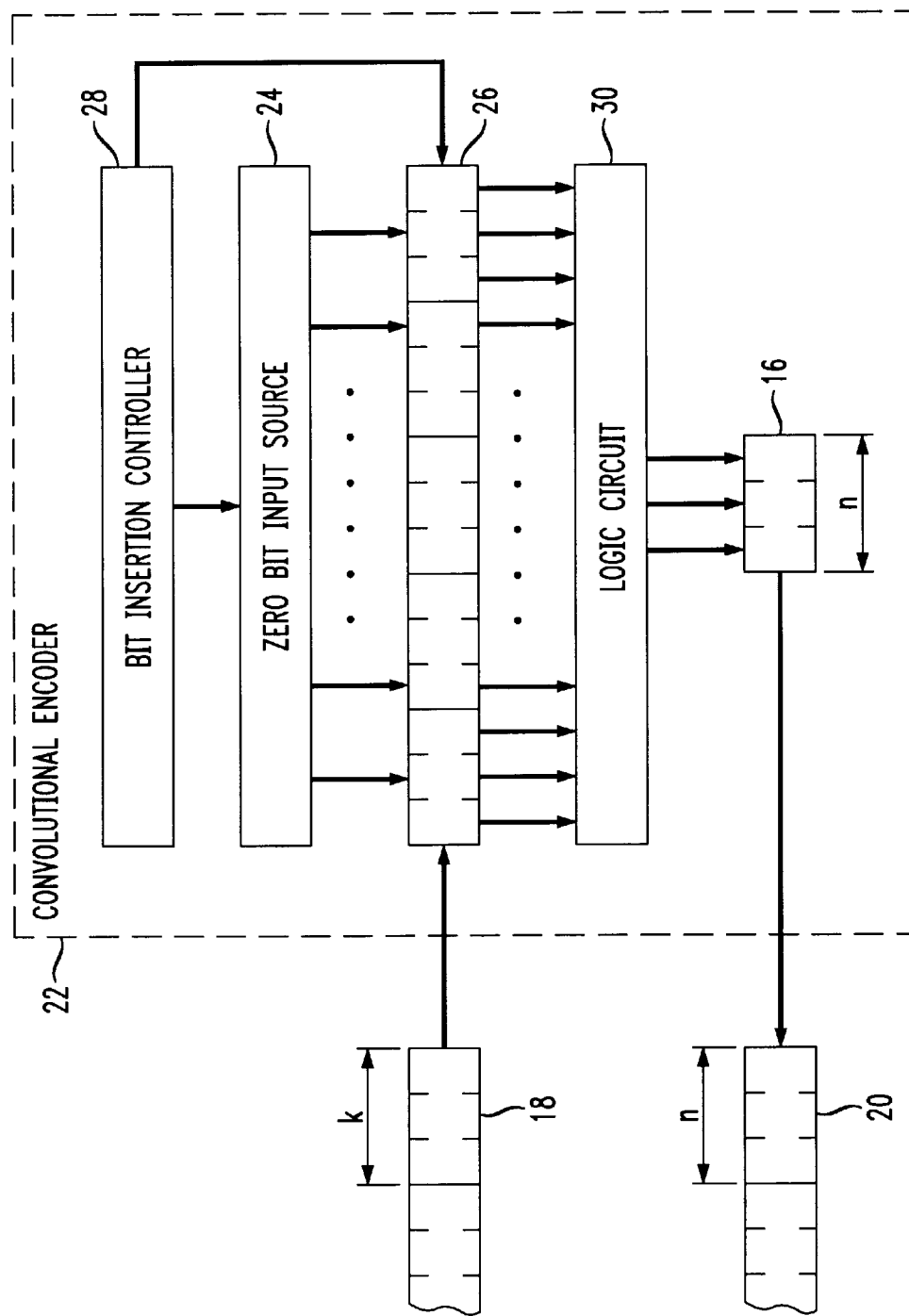
FIG. 2 is a schematic block diagram of a convolutional encoder implementing bit insertion in accordance with the invention.

Referring in specific detail to the drawings, wherein common reference numbers identifying similar or identical elements, steps, and features, FIG. 2 illustrates a convolutional encoder 22 embodying the present invention.

Figure 3:
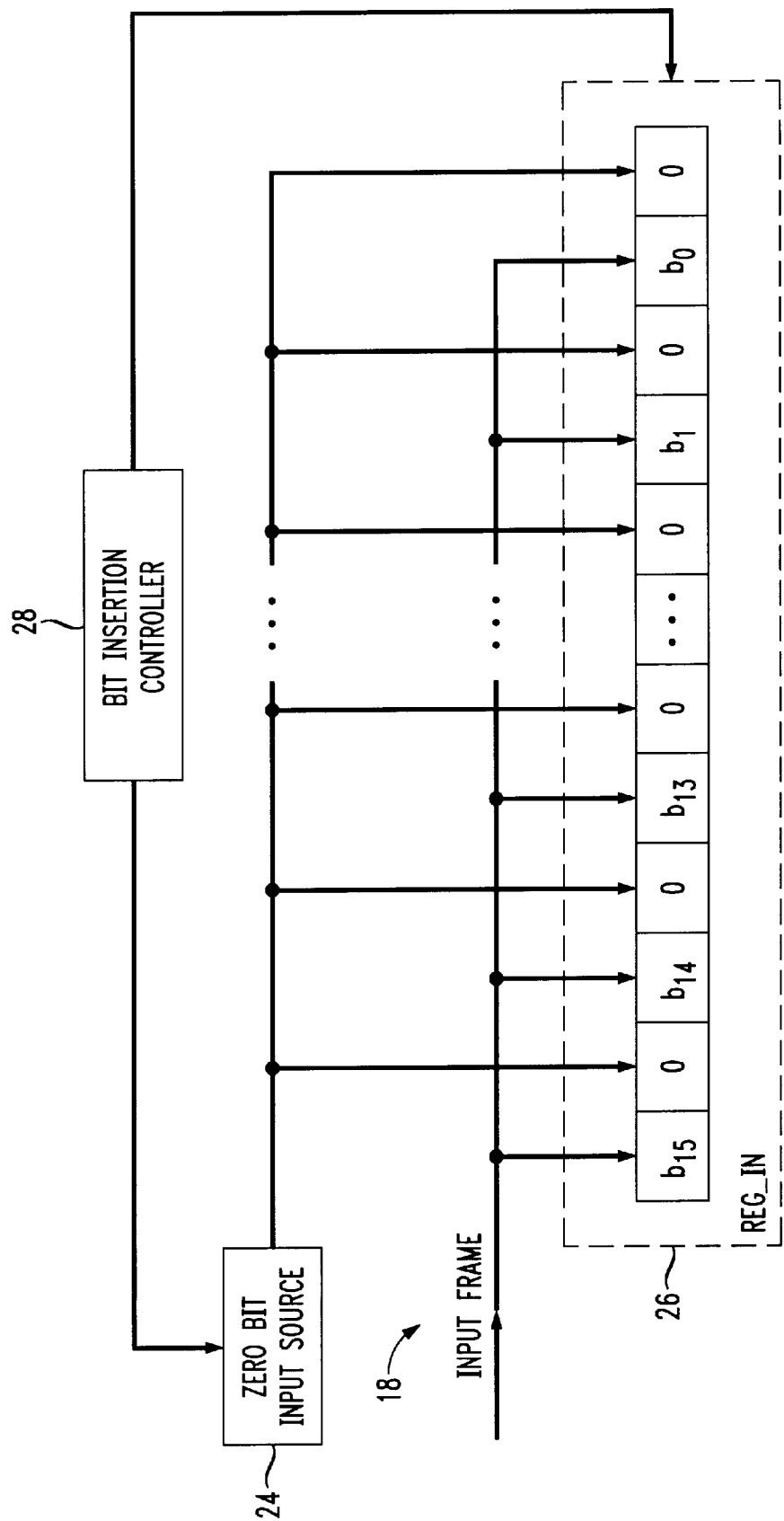
FIG. 3 illustrates the components of the convolutional encoder of FIG. 2 in greater detail to show bit insertion into an input register.

The convolutional encoder 22 inserts predetermined bits into an input register 26 in conjunction with the loading of the input bits from an input frame 18. In an illustrative embodiment, zero bits from source 24 are interleaved with input frame bits in an alternating manner to load the input register 26 (labelled REG_IN), as shown in FIG. 3. For an input frame having sixteen input bits, the input register 26 is loaded with a total of thirty-two bits as follows:

$$REG\_IN = b_{15}, 0, b_{14}, 0, \ldots b_2, 0, b_1, 0b_0, 0, b_{-1}, 0 \ldots b_{-4}, 0 \qquad (7)$$

where the "b" bits are input from e bits. Thus, the register includes the same input bits from the input frame as the input register of Equation (3) in the prior art, but also has interleaved 0 bits inserted therein and has a total length of forty bits.

It is understood that the source of predetermined bits may be a set of switches and/or transistors, a common connection to ground representing logic 0 using positive logic, or a register having a predetermined bit sequence; for example, at least sixteen bits of zeros. Alternatively, other predetermined bits and bit sequences may be used such as a sequence of logic 1 values using positive logic.

The disclosed convolutional encoder 22 may also include a bit insertion controller 28 for controlling the loading of the input register 26. For example, with the input register 26 as a shift register, the bit insertion controller 28 may cause the input register 26 to successively shift to receive the input bits arriving serially. The zero bit input source 24 may also input a zero bit to the input register 26 as the input register 26 shifts, with the zero bits and input bits being input in alternate shifts, until the input register 26 is full.

In an alternative embodiment, such as shown in FIG. 3, the input register 26 may latch the input bits and the zero bits in parallel, with the zero bits alternating in position with the input bits, and with the latching being controlled by the bit insertion controller 28. Accordingly, the convolutional encoder 22 may also include a serial-to-parallel digital data converter (not shown in FIGS. 2–3) to convert the serially received input bits in the input frame 18 to a parallel sequence of bits.

In another alternative embodiment, the input frame 18 and the zero bit input source 24 may be sampled in an alternating manner by a multiplexer with the sampled bits being input successively to the input register 26.

Figure 4:
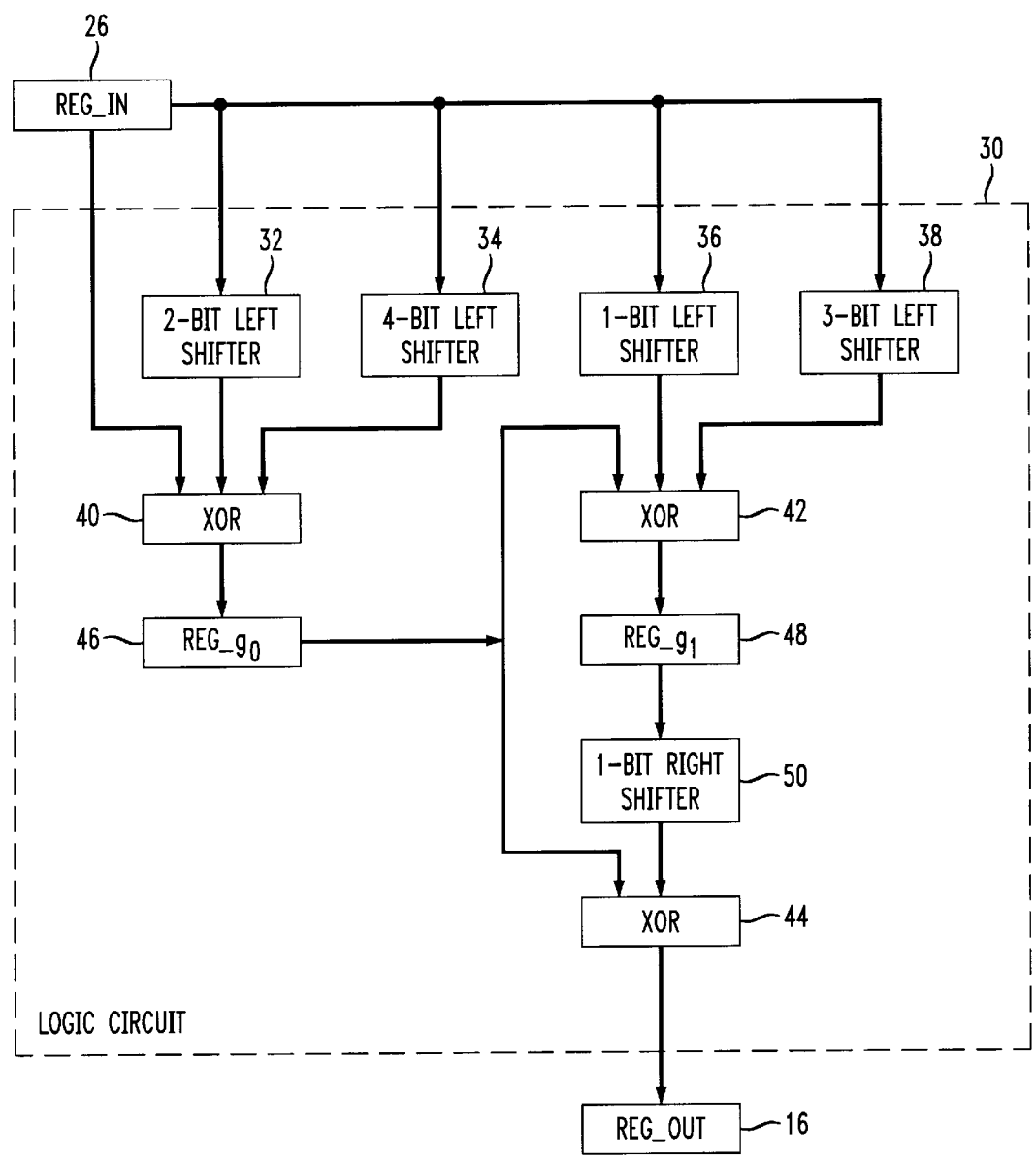
FIG. 4 illustrates the logic circuit of FIG. 2 in greater detail.

When the input register 26 stores a current set of thirty-two bits comprising sixteen input bits alternating with sixteen zero bits, the convolutional encoder 22 performs the generator polynomial functions to implement the generator polynomials in Equations (1)–(2) using the logic circuit 30. In an illustrative embodiment, the logic circuit 30 has a set of left shift registers or shifters 32–38; a set of exclusive-OR (XOR) gates 40, 42 and 44; a pair of polynomial registers 46, 48 labelled REG_$g_0$ and REG_$g_1$, respectively, for storing the polynomial functions; and a right shift register or shifter 50. The logic circuit 30 in FIG. 4 is configured to generate the contents of the output register 16 (labelled REG_OUT) according to the following equations:

$$REG\_g_0 = REG\_IN \oplus (REG\_IN <<4) \oplus (REG\_IN <<8) \qquad (8)$$

$$REG\_g_1 = REG\_g_0 \oplus (REG\_IN <<2) \oplus (REG\_IN <<6) \qquad (9)$$

$$REG\_OUT = REG\_g_0 \oplus (REG\_g_1 >>1) \qquad (10)$$

in which (T>>1) is a one-bit right shift operation of a register labelled T.

In an alternative embodiment, the REG_$g_0$ register 46 may be right shifted with the REG_$g_1$ unchanged, depending on the order of the insertion of the zero bits relative to the input bits. In alternative embodiments, the REG_$g_1$ register 48 may be left shifted and the REG $g_0$ unchanged, depending on the order of the insertion of the zero bits and the lengths of the registers.

As shown above, in Equations (8)–(9) extend Equations (4)–(5) to take into account the zero-bit insertion, and may be implemented with some common components. For example, the 2-bit left shifter 32, the 4-bit left shifter 34, the 1-bit left shifter 36, and the 3-bit left shifter 38 may be used as in the prior art but with each of the shifters 32–38 performing two left shifts to perform 4-bit, 8-bit, 2-bit, and 6-bit shifts, respectively, to implement Equations (8)–(9). In addition, to implement Equations (8)–(9), XOR gates 40, 42 may be used in the illustrative embodiment shown in FIG. 4. Although separate shifters are shown in FIG. 4 for purposes of illustration, those skilled in the art will appreciate that equivalent functionality can be obtained by tapping off a register (e.g. tapping at the second stage to get a 2-bit left shift etc.)

Logic circuit 30 implements Equations (8)–(9) in a manner different from the prior art implementing Equations (4)–(5). For example, in the illustrative embodiment for sixteen bit input frames, the registers in Equations (8)–(9) are thirty-two bits in length, while the registers in Equations (4)–(5) are sixteen bits in length. In addition, the input register REG_IN of Equations (8)–(9) has alternating input bits and zero bits generated by the disclosed convolutional encoder 22 of FIGS. 2–3. In a different manner, the input register REG_IN of Equations (4)–(5) in the prior art has only input bits, which requires the interleaving of the generated registers REG_$g_0$ and REG_$g_1$.

The disclosed logic circuit 30 may implement Equation (10) above to generate the output register REG_OUT using, in an illustrative embodiment, the 1-bit right shifter 50 which right-shifts the REG_$g_1$ register 48, with the shifted output XORed with the REG_$g_0$ by the XOR gate 44. Typically, however, the equations would be performed in a digital signal processor, such as the DSP 16000 available from Lucent Technologies. In such a realization, the processing steps would be programmed to take advantage of registers, mathematical and logic circuits available in the processor.

By implementing Equation (10) in the convolutional encoder 22 instead of interleaving REG_$g_0$ and REG_$g_1$, the convolutional encoder 22 has a reduced number of processing cycles than the convolutional encoders in the prior art. For example, by introducing the bit zero insertion as in FIGS. 2–3, the disclosed convolutional encoder 22 uses about 3 cycles per input bit using, for example, a DSP 16000 digital signal processor. However, interleaving REG_$g_0$ and REG_$g_1$ would require about 6 cycles per input bit in the same processor.

The convolutional encoder 22 may realize a net processing cycle gain of 3 cycles per input bit, so the disclosed convolutional encoder 22 generally operates using about half of the number of the processing cycles as in prior art convolutional encoders, affording an effective doubling of processing speed.

For large input frames having sixteen or more input bits per frame, such cycle gains of 3 cycles per input bit provide a significant performance improvement for encoding input data such as in communication processing in which, for example, real-time voice signals may be involved.

Figure 5:
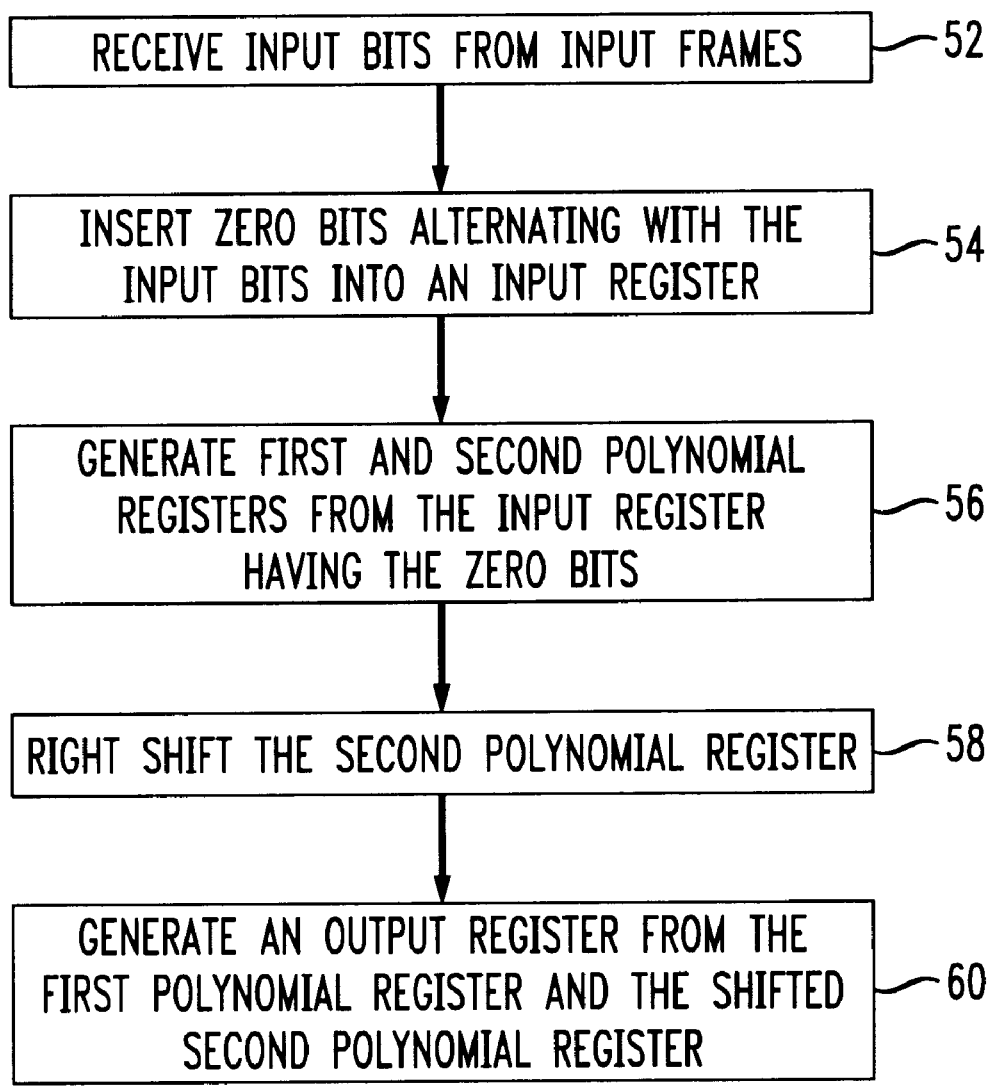
FIG. 5 is a flow chart illustrating the method of operation of convolutional encoder incorporating the invention.

As shown in FIG. 5, convolutional encoder 22 operates according to a method including the steps of: receiving input bits from input frames 18 (step 52); inserting zero bits alternating with the input bits into an input register 26 (step 54), as shown in FIG. 3; generating a first polynomial in register 46 and a second polynomial in register 48 from the input register 26 (step 56) using, for example, the left shifters 32–38 and the XOR gates 40, 42 shown in FIG. 4. The method then right shifts the second polynomial register 48 (step 58) using, for example, a 1-bit right shifter 50; and generates output to an output register 16 from the first polynomial register 46 and the shifted second polynomial register 48 (step 60) using, for example, an XOR gate 44 as shown in FIG. 4.

Convolutional encoder 22 using bit zero insertion as described above may be implemented for different code rates having rate R=k/n and associated generator polynomials, since the use of bit zero insertion in convolutional encoder 22 is not dependent upon the generator polynomials. As indicated above, convolutional encoder 22 implements the same generator polynomials as in Equations (4)–(5) and (8)–(9), but using registers of different lengths and different bit sequences; that is, with zero bits being inserted therein.

Accordingly, k/n convolutional encoders may be adapted to incorporate bit zero insertion and the elimination of interleaving as in convolutional encoder 22 and logic circuit 30.

For example, for 1/n convolutional encoders, (n−1) zeros may be inserted between bits of the input bit sequences, and Equations (4)–(5) may be adapted to be:

$$REG\_g_0 = REG\_IN \oplus (REG\_IN << (2*n)) \oplus (REG\_IN << (4*n))$$

$$REG\_g_1 = REG\_g_0 \oplus (REG\_IN << (1*n)) \oplus (REG\_IN << (3*n))$$

which reduces to Equations (8)–(9) when n=2.

For a generalized k/n encoder, the polynomial registers may be split into k parallel 1/n encoders, with each 1/n encoder implementing Equations (11)–(12) with appropriate left shift registers as described above. The outputs of the k parallel 1/n encoders may then be EXCLUSIVE-ORed to generate the final output as a k/n convolutionally encoded output.

While the disclosed convolutional encoder 22 and method are particularly shown and described herein with reference to the preferred embodiments, it is to be understood that various modifications in form and detail may be made without departing from the scope and spirit of the present invention. Accordingly, modifications such as any examples suggested herein, but not limited thereto, are considered within the scope of the present invention.

What is claimed is:

1. An encoder for convolutionally encoding input bits of a data signal, the convolutional encoder comprising:

a combiner, including an input register, which inserts at least one predetermined bit in between each of the input bits of the input register;

a plurality of polynomial combiners each combining a plurality of variously shifted versions of the input register contents to produce a plurality of polynomial signals; and an output generator combining a shifted version of at least one of the polynomial signals with the other polynomial signals by a logical operation in order to produce an encoded output.

2. The convolutional encoder of claim 1, wherein the combiner inserts zero bits as the predetermined bits.

3. The convolutional encoder of claim 1, wherein the polynomial combiners include means for generating shifted versions of the input register content.

4. The convolutional encoder of claim 1, wherein at least one of the polynomial combiners includes EXCLUSIVE OR gates.

5. The convolutional encoder of claim 1, wherein the polynomial combiners include EXCLUSIVE OR circuits which generate signals $REG\_g_0$ and $REG\_g_1$, defined by:

$$REG\_g_0 = REG\_IN \oplus S2 \oplus S4, \text{ and}$$

$$REG\_g_1 = REG\_g_0 \oplus S1 \oplus S3,$$

wherein REG_IN represent the input register content S1, S2, S3, and S4 correspond to REG_IN shifted left by 1, 2, 3, and 4 bits, respectively.

6. The convolutional encoder of claim 1, wherein the output generator includes an XOR gate.

7. The convolutional encoder of claim 1, wherein the output generator includes an XOR circuit for generating the encoded output, REG_OUT defined as:

$$REG\_OUT = REG\_g_0 \oplus (REG\_g_1 << 1);$$

wherein $REG\_g_0$ and $REG\_g_1$ are polynomial combiner outputs of first and second polynomial combiners and $(REG\_g_1 >> 1)$ is the second polynomial combiner output shifted right by one bit.

8. A method for convolutionally encoding received input bits in a data processor, the method comprising the steps of:

inserting at least one predetermined bit in between each of the input bits of an input register in the processor;

producing a group of polynomial signals by combining a plurality of variously shifted versions of the input register contents; and generating an encoded output by combining a shifted version of at least one of the polynomial signal with the other polynomial signals by a logical operation in order to produce an encoded output.

9. The method of claim 8, wherein the predetermined bits are zero bits.

10. The method of claim 8, wherein first and second polynomial signals are produced, and wherein the generating step includes the steps of:

shifting the second polynomial signal; and

XORing the first polynomial signal with the shifted second polynomial signal.

* * * * *